United States Patent [19]

Tanaka

[11] Patent Number: 4,695,756
[45] Date of Patent: Sep. 22, 1987

[54] LAMINATED TERMINAL LAYER FOR ELECTRONIC COMPONENT

[75] Inventor: Yasuhiro Tanaka, Ishikawa, Japan

[73] Assignee: Murata Manufacturing Co., Ltd., Kyoto, Japan

[21] Appl. No.: 895,580

[22] Filed: Aug. 13, 1986

Related U.S. Application Data

[63] Continuation of Ser. No. 612,598, May 21, 1984, abandoned.

[30] Foreign Application Priority Data

May 21, 1983 [JP] Japan ............................. 58-77406[U]

[51] Int. Cl.4 ............................................. H01L 41/08
[52] U.S. Cl. ................................... 310/355; 310/354; 310/326; 310/364
[58] Field of Search .................... 310/344, 354–356, 310/326, 327, 364

[56] References Cited

U.S. PATENT DOCUMENTS

| | | | |
|---|---|---|---|
| 2,078,284 | 4/1937 | Schrader et al. | 310/356 |
| 2,124,596 | 7/1938 | Sykes | 310/355 |
| 2,155,035 | 4/1939 | Bieling | 310/355 |
| 3,851,194 | 11/1974 | Kawada | 310/364 |
| 4,267,480 | 5/1981 | Kanematsu | 310/354 X |
| 4,308,482 | 12/1981 | Kadohashi | 310/354 |
| 4,322,652 | 3/1982 | Otsuka | 310/354 X |
| 4,360,754 | 11/1982 | Toyoshima . | |
| 4,431,938 | 2/1984 | Inoue | 310/355 X |

Primary Examiner—Mark O. Budd
Attorney, Agent, or Firm—Birch, Stewart, Kolasch & Birch

[57] ABSTRACT

A laminated terminal layer is at least a double layer comprising a first layer made of a hard material and a second layer made of a soft material. The first layer is flexible. The second layer is overlapped on the first layer and in contact with an electrode of a piezoelectric ceramic resonator. Preferably, the hard material is phosphor bronze and the soft material is Al, Ag, or Pb as a simple substance or, any alloy thereof.

9 Claims, 6 Drawing Figures

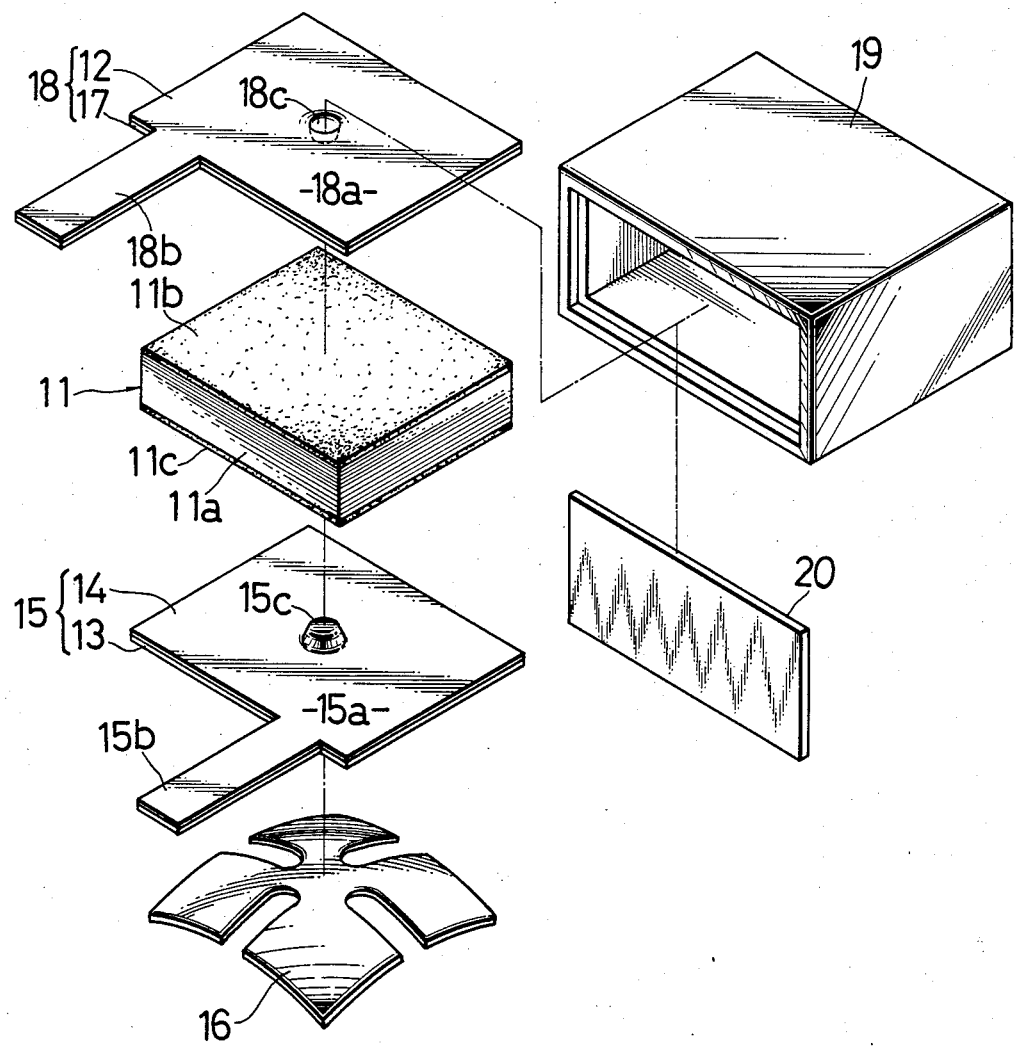

LAMINATED TERMINAL LAYER FOR ELECTRONIC COMPONENT

This is a continuation of application Ser. No. 612,598, filed May 21, 1984 and now abandoned.

FIELD OF THE INVENTION

The present invention relates to a terminal of an electronic device and, more particularly, to a laminated terminal layer for an electronic component sealed within a case.

DESCRIPTION OF THE PRIOR ART

FIG. 1 is a perspective view of a conventional sealed case of an electronic component. FIG. 2 is a cross-sectional view of the sealed case of FIG. 1. FIG. 3 is a partially enlarged view of the contact between an electrode layer of the electronic component and a projection point on a terminal plate.

For example, the electronic component in the sealed case of FIG. 1 is a resonator composed of a piezoelectric precisely cut piezoelectric ceramic whose natural frequency of vibrations operating under expansion mode is used, for example, to control or stabilize the frequency of an oscillator.

Referring now to FIGS. 1 to 3, a sealed case 1 is a rectangular solid having a cavity which includes a piezoelectric resonator 2. The piezoelectric resonator 2 comprises a piezoelectric ceramic substrate 2a having a pair of electrodes 2b and 2c.

A pair of terminal plates 3 and 4 are provided for binding the piezoelectric resonator 2 within the sealted case 1 and communicating electrical signals with the piezoelectric resonator 2. Each of the pair of terminal plates 3 and 4 is provided with projection points 3a and 4a. Each of the projection points 3a and 4a projects from the center of each of the terminal plates 3 and 4 so as to form an electrical contact with a vibration node of the piezoelectric resonator 2. A sealing resin 5 is located on a base plate (not shown), to seal the piezoelectric resonator 2 within the cavity of the sealed case 1. The base plate is provided for preventing the liquid of the sealing resin 5 from invading the cavity of the sealed case 1 before the liquid of the sealing resin 5 becomes solid. A spring plate 7 is provided for elastically supporting the piezoelectric resonator 2 bound by the terminal plates 3 and 4. Thus, the piezoelectric resonator 2 is sealed within the cavity of the case 1.

As FIG. 3 shows, each of the projection points 3a and 4a is in contact with the oscillation node of the piezoelectric resonator 2 to make the electrical contact with the piezoelectric resonator 2 and suspend it. Therefore, the material of each of the terminal plates 3 and 4 must be not only conductive to input and output the electrical signals but also flexible to suspend the piezoelectric resonator 2.

Conventionally, the material of each of the terminal plates 3 and 4 is a combination of a single base layer composed of phosphor bronze etc, and a thin plate layer disposed on the surface of the single base material. The thin plate layer is formed on the shaped terminal plate to prevent decomposition and enhance soldering property. Thus, the properties of the conventional terminal plates 3 and 4 depend directly on the properties of the base layer. When the material of the base layer is phosphor bronze, it is very flexible but rather hard. In case the binding strength of terminal plates 3 and 4 to be applied to the piezoelectric resonator 2 is very strong due to the spring plate 7 or so, each of the projection points 3a and 4a may scrape each of the pair of electrodes 2b and 2c of the piezoelectric resonator 2 during the vibration, so that the piezoelectric resonator 2 may be damaged. In accordance with the vibration of the piezoelectric resonator 2, each of the terminal plates can be vibrated, so that the electric property of the piezoelectric resonator 2 cannot be obtained.

SUMMARY OF THE INVENTION

Accordingly, it is an object of the present invention to provide an improved terminal layer in contact with an electronic component.

It is another object of the present invention to provide an improved laminated terminal layer in contact with an electrode layer of an electronic component.

It is still another object of the present invention to provide an improved composition of a laminated terminal layer in contact with an electrode layer of an electronic component.

It is a further object of the present invention to provide an improved composition of a laminated terminal layer in contact with an electrode layer of an electronic component, the laminated terminal layer comprising at least two different materials whose physical characteristics are opposite to each other so as to compensate each other in flexibility and hardness.

It is a further object of the present invention to provide an improved composition of a laminated terminal layer in contact with an electrode layer of a piezoelectric resonator, the laminated terminal layer comprising at least two different materials whose physical characteristics are opposite to each other so as to compensate and cooperate with each other in flexibility and hardness.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a laminated terminal layer to be in contact with an electrode comprises a first layer made of a hard material and being flexible, and a second layer made of a soft material. The second layer is laminated on the first layer and is in contact with the electrode. Preferably, the hard material is phosphor bronze and the soft material is Al, Ag, or Pb as a simple substance or, any alloy thereof. The thickness of the second layer is 5% or more as thick as that of the first layer.

BRIEF DESCRIPTION OF THE DRAWINGS

The present invention will become more fully understood from the detailed description given hereinbelow and the accompanying drawings which are given by way of illustration only, and thus are not limitative of the scope of the present invention and wherein;

FIG. 6 is an exploded perspective view of the sealed case of FIG. 4.

DESCRIPTION OF THE PREFERRED EMBODIMENTS

Figure 1:
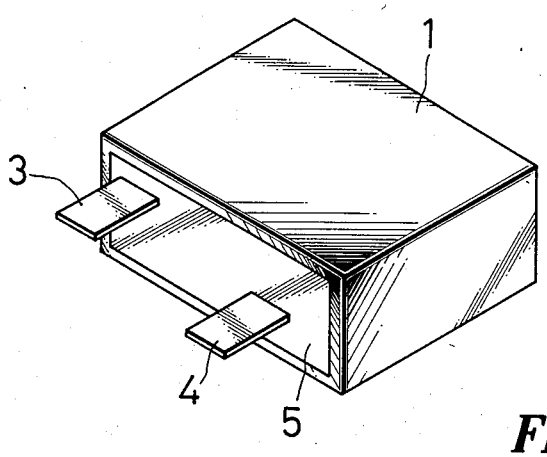
FIG. 1 is a perspective view of a conventional sealed case of an electronic component.
Figure 2:
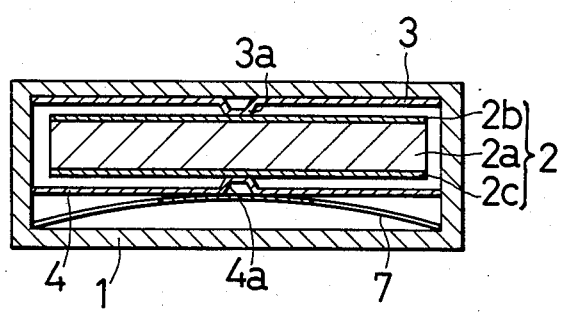
FIG. 2 is a cross-sectional view of the sealed case of FIG. 1.
Figure 3:
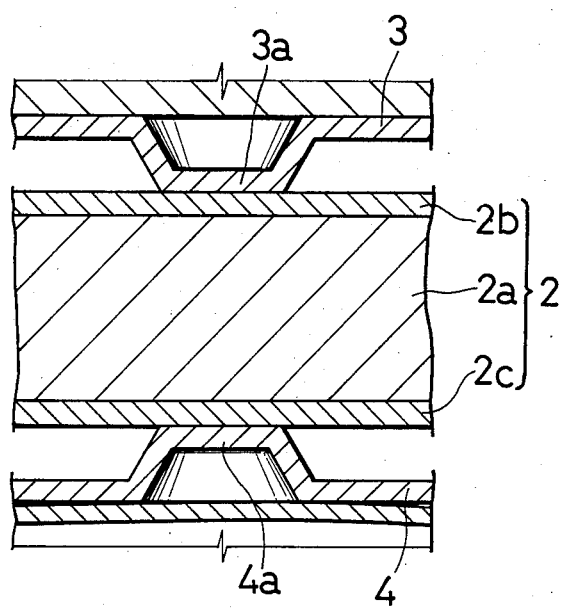
FIG. 3 is a partially enlarged view of the contact between an electrode layer of the electronic component and a projection point of a terminal plate in the sealed case of FIG. 2.
Figure 4:
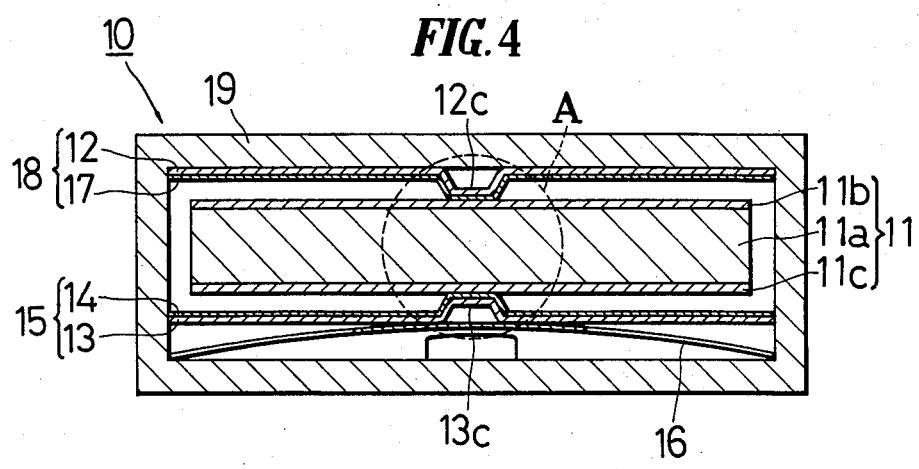
FIG. 4 is a cross-sectional view of a sealed case of an electronic component according to the present invention.
Figure 5:
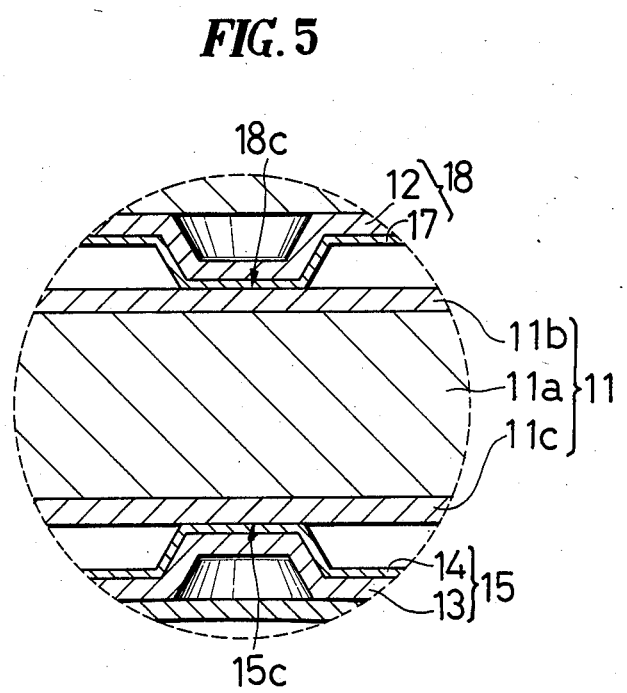
FIG. 5 is a partially enlarged view of the contact between an electrode layer of the electronic component and a projection point of a terminal plate in a dotted circle A the sealed case of FIG. 4.

FIG. 4 is a cross-sectional view of a sealed case of an electronic component such as a piezoelectric resonator according to the present invention. FIG. 5 is a partially enlarged view of the contact between an electrode terminal layer of the electronic component and a projection point of a terminal plate (in dotted circle A) of the sealed case of FIG. 4. FIG. 6 is an exploded perspective view of the sealed case of FIG. 4.

Referring now to FIGS. 4, 5, and 6, the electronic component is, for example, a piezoelectric ceramic resonator 10 operating under expansion mode, comprising a precisely cut piezoelectric ceramic element 11. The piezoelectric ceramic element 11 comprises a piezoelectric ceramic substrate 11a having a pair of electrodes 11b and 11c. A pair of terminal plates 15 and 18 are provided for gripping the piezoelectric ceramic element 11 and providing electrical signals to it. Each of the terminal plates 15 and 18 is a double layer so that the terminal plates 15(18) comprise a first layer 13(12) and a second layer 14(17). Each of the terminal plates 15 and 18 is provided with each of rectangular plates 15a and 18a and each of lead-in terminals 15b and 18b. Each of the lead-in terminals 15b and 18b is extended from each of the rectangular plates 15a and 18a to externally supply the electrical signals. Each of projection points 18c and 15c projects from the center of each of the rectangular plates 18a and 15a so as to make an electrical contact with a vibration node of the piezoelectric ceramic element 11. The terminal plates 15 and 18 are provided for supporting the piezoelectric ceramic element 11 at both major sides while the piezoelectric resonator 10 is accommodated within a sealed case 19 made of a synthetic resin.

A flower-shaped rhombus spring 16 is provided which is interposed between the terminal plate 15 and an inner surface of a cavity of the sealed case 19 to elastically support the piezoelectric resonator 10. As FIG. 6 shows, a sealing resin is layered on a base plate 20 to seal the piezoelectric resonator 10 within the cavity of the sealed case 10. The base plate 20 is provided for preventing the liquid of the sealing resin from invading the cavity of the sealed case 19 before the liquid of the sealing resin becomes solid. Preferably, the base plate 16 comprises two laminated layers of a synthetic resin sheet composed of polyester or the like and paper sheet enough to bond to the sealing resin. The synthetic resin sheet surface of the base plate 20 confronts the inner side of the cavity of the sealed case 19 while the paper sheet surface of the base plate 20 confronts the outer side of the cavity and the sealing resin layer. Each of the lead-in terminals 18b and 15b penetrates the sealing resin layer and the base plate 20.

As FIG. 5 shows, the terminal plate 15(18) comprises the first layer 13(12) and the second layer 14(17), as stated above, according to the present invention. Since both terminal plates 15 and 18 show the similar configuration, the terminal plate 15 only is described in detail. The first layer 13 is made of phosphor bronze and the second layer is made of Al, Ag, or Pb as a simple substance, or any alloy thereof. The second layer 14 is laminated on and combined with the first layer 13 such that each characteristic is not spoiled. That is, the material of the first layer 13 is hard and flexible while the material of the second layer 14 is soft. Both layers 13 and 14 are formed as a kind of clad layer. The soft material of the second layer 14 makes contact with the electrode 11c of the piezoelectric ceramic element 11 so that the electrode 11c is prevented from being scraped away. Preferably, the thickness of the second layer 14 is 5% or more as thick as that of the first layer 13.

The terminal plate 18 comprises the first layer 12 made of the hard material such as phosphor bronze and the second layer 17 made of the soft material such as Al, Ag, or Pb as a simple substance, or any alloy thereof. The second layer 17 makes contact with the electrode 11b of the piezoelectric ceramic element 11.

In place of the clad layer, the first layer 13(12) and the second layer 14(17) may be bonded with welding, brazing, any adhesive, or any bonding method. The second layer 14(17) may be formed with plating, though the second layer must be thick as compared with the prior art.

On account of the above-described laminated layer of each of the terminal plates 15 and 18, the piezoelectric ceramic element 11 can be suspended by both plates 15 and 18 due to the flexibility of the first layers 13 and 12. Any shock to the piezoelectric ceramic element 11 can be absorbed by easily deforming the second layers 14 and 17. The electrodes 11b and 11c of the piezoelectric ceramic element 11 and, moreover, the piezoelectric ceramic element 11 are thereby prevented from being damaged. Thus, the disadvantages of the materials of the first layer 13(12) and the second layer 14(17) can be compensated to thereby provide the advantages due to their combination.

It is to be noted that the materials of the first layer 13(12) and the second layer 14(17) should not be limited to the above examples. If it can be estimated that, together with the piezoelectric ceramic element 11, the terminal plates 15 and 18 are vibrated, it may be possible to add any anti-vibration material into the terminal plates 15 and 18 to prevent it. The number of overlapping the layers should not be limited to two. Three or more layers can be laminated to form the terminal plates 15 and 18. Although, in the above preferred form of the present invention, the entire surface of the first layer 13(12) is overlapped by the surface of the second layer 14(17), it may be possible that at least a part of the first layer 13(12), for example, at the projection point 18c(15c) is covered by the second layer 14(17).

Further, it is to be noted that the piezoelectric ceramic element 11 can be replaced by any other circuit element. Basically, the gist of the present invention that the terminal plate 15(18) comprises at least double layer can be applied to any electric terminal structure of any other electric circuit.

As described above, in accordance with the present invention, each of the terminal plates has the double layer comprising the layers of each different physical characteristic such that the advantage of each layer is not spoiled. The materials of the laminated layers are selected so that the terminal plates can not damage the circuit element suspended by the terminal plates.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A piezoelectric resonator, comprising:
   a housing having an opening for accommodating piezoelectric components, said components comprising:
   a piezoelectric means having a flat piezoelectric member with electrodes formed on both sides thereof;
   two terminal plates each interposed between an inner wall of said housing and one side of said piezoelectric means and being provided with a projection to contact a vibration node on each of said electrodes;
   each of said terminal plates comprising a first layer of phosphor bronze and a second layer, for reducing vibration received by said piezoelectric means, having a thickness equal to 5% or more of the thickness of said first layer, of a member selected from the group consisting of Al, Ag, Pb or any alloy thereof laminated on said first layer in a manner such that said second layer contacts each of said electrodes; and
   lead means extending from each of said two terminal plates through said opening.

2. The piezoelectric resonator of claim 1, further comprising means for sealing said piezoelectric components in said housing.

3. The piezoelectric resonator of claim 1, which is a ceramic piezoelectric resonator.

4. The piezoelectric resonator of claim 1, wherein said first layer and said second layer are a clad layer.

5. The piezoelectric resonator of claim 1, wherein said first layer and said second layer are bonded.

6. The piezoelectric resonator of claim 1, wherein said laminated terminal layer is provided with a plurality of layers.

7. The piezoelectric resonator of claim 1, further comprising an anti-vibration material for preventing said laminated terminal layer from being vibrated.

8. The piezoelectric resonator of claim 1, wherein said second layer overlaps said first layer at a selected portion.

9. The piezoelectric resonator of claim 8, wherein, at said selected portion, said second layer is in contact with said electrode.

* * * * *